United States Patent
Lin et al.

(10) Patent No.: US 10,991,754 B2
(45) Date of Patent: Apr. 27, 2021

(54) DISPLAY DEVICE WITH STACKING DESIGN OF SENSING ELEMENT

(71) Applicant: Innolux Corporation, Miao-Li County (TW)

(72) Inventors: Ya-Yun Lin, Miao-Li County (TW); Chuan-Chi Chien, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 66 days.

(21) Appl. No.: 16/105,238

(22) Filed: Aug. 20, 2018

(65) Prior Publication Data

US 2019/0096953 A1 Mar. 28, 2019

(30) Foreign Application Priority Data

Sep. 22, 2017 (CN) .......................... 201710865602.7

(51) Int. Cl.
*H01L 27/15* (2006.01)
*H01L 31/12* (2006.01)
(Continued)

(52) U.S. Cl.
CPC .............. *H01L 27/15* (2013.01); *G06F 3/042* (2013.01); *G06F 3/0412* (2013.01); *H01L 31/105* (2013.01)

(58) Field of Classification Search
CPC ............. H01L 31/105; H01L 27/14636; H01L 27/14612; H01L 27/14663; H01L 27/14634; G06F 3/0412
(Continued)

(56) References Cited

U.S. PATENT DOCUMENTS 10,255,475 B2  4/2019 Liu et al.
2006/0273998 A1* 12/2006 Young .................. H01L 27/3211
                                                    345/81

(Continued)

FOREIGN PATENT DOCUMENTS

| CN | 101826520 A | 9/2010 |
|----|-------------|--------|
| CN | 105373772 A | 3/2016 |
| JP | 2001068680 A | 3/2001 |

OTHER PUBLICATIONS

CN Office Action dated Mar. 12, 2020 in Chinese application (No. 201710865602.7).

*Primary Examiner* — Duy T Nguyen
*Assistant Examiner* — Dilinh P Nguyen
(74) *Attorney, Agent, or Firm* — McClure, Qualey & Rodack, LLP

(57) ABSTRACT

A display device including a display panel is provided. The display panel includes a first substrate, a first transistor, a sensing element, a first conductive layer and a second conductive layer. The first transistor is disposed on the first substrate. The sensing element is disposed on the first substrate and electrically connected to the first transistor. The sensing element includes a first-type semiconductor layer, an insulation layer and a second-type semiconductor layer. The insulation layer is disposed on the first-type semiconductor layer. The second-type semiconductor layer is disposed on the insulation layer. The first conductive layer is disposed between the first substrate and the sensing element, and the first conductive layer contacts with and electrically connected to the first-type semiconductor layer. The second conductive layer is disposed on the sensing element, and the second conductive layer contacts with and electrically connected to the second-type semiconductor layer.

19 Claims, 12 Drawing Sheets

(51) Int. Cl.
  *H01L 33/00*   (2010.01)
  *H01L 31/105*  (2006.01)
  *G06F 3/042*   (2006.01)
  *G06F 3/041*   (2006.01)

(58) Field of Classification Search
  USPC .......................................................... 257/80
  See application file for complete search history.

(56) References Cited

U.S. PATENT DOCUMENTS

2015/0349242 A1\* 12/2015 Shiu ..................... H01L 43/04
                                                      257/773
2017/0102596 A1   4/2017 Sugimoto
2018/0138283 A1   5/2018 Kimura \* cited by examiner

DISPLAY DEVICE WITH STACKING DESIGN OF SENSING ELEMENT

This application claims the benefit of People's Republic of China application Serial No. 201710865602.7, filed Sep. 22, 2017, the subject matter of which is incorporated herein by reference.

BACKGROUND OF THE INVENTION

Field of the Invention

The invention relates in general to a display device, and more particularly to a display device having a sensing element disposed in the display region.

Description of the Related Art

In recent years, the design of the display panel for mobile phones, automotive devices, or wearable devices is directed towards full display screen. Currently, most applications of the optical sensing technology employ horizontal PIN sensors (the P-type semiconductor layer and the N-type semiconductor layer may be disposed on the same layer), and the insulation layer is dispose between the P-type semiconductor layer and the N-type semiconductor layer. In a top view of the display panel, a part of the insulation layer does not overlap the P-type semiconductor layer or the N-type semiconductor layer. The above design requires an additional capacitor storage area or a signal transfer wire. Since the capacitor storage area cannot be reduced, the capacitor storage needs to occupy a part of the display opening region. However, it is necessary to consider the aperture ratio, so the optical-type light receiving region of the optical sensor cannot be unrestricted increase. A small-sized light receiving region of the optical sensor causes the light receiving capacity being limited, or reducing the sensitivity of recognition. Therefore, how to increase the light sensitivity and aperture ratio has become a prominent task for the industries.

SUMMARY OF THE INVENTION

According to one embodiment of the present invention, a display device including a display panel is provided. The display panel includes a first substrate, a first transistor, a sensing element, a first conductive layer and a second conductive layer. The first transistor is disposed on the first substrate. The sensing element is disposed on the first substrate, and the sensing element electrically connected to the first transistor. The sensing element includes a first-type semiconductor layer, an insulation layer and a second-type semiconductor layer. The insulation layer is disposed on the first-type semiconductor layer. The second-type semiconductor layer is disposed on the insulation layer. The first conductive layer is disposed between the first substrate and the sensing element, and the first conductive layer contacts with and electrically connected to the first-type semiconductor layer. The second conductive layer is disposed on the sensing element, and the second conductive layer contacts with and electrically connected to the second-type semiconductor layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
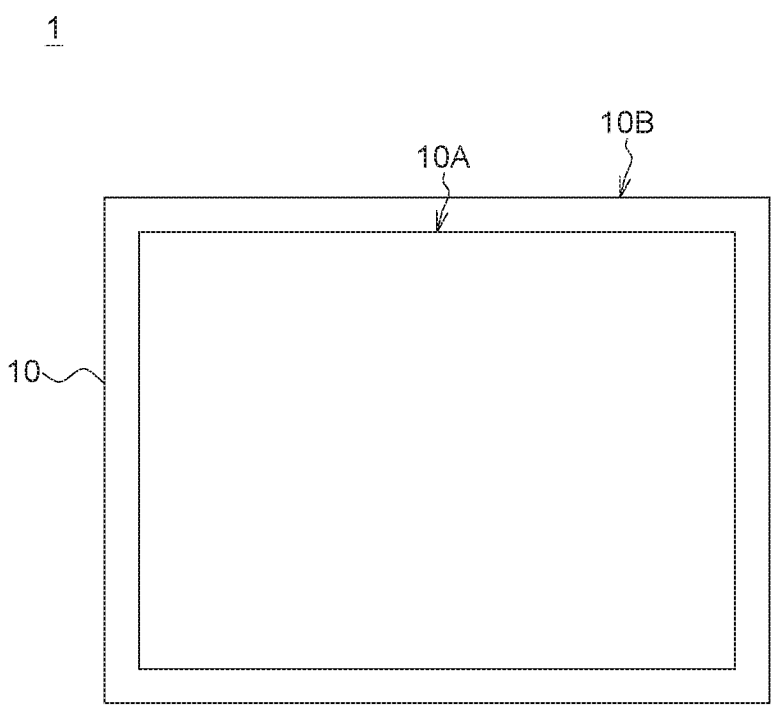
FIG. 1A is a top view of a display device according to an embodiment of the present disclosure.

In a display panel of a display device according to the embodiments of the present disclosure, a sensing element is disposed between a first conductive layer and a second conductive layer, the first conductive layer can share the same insulation layer with a storage capacitor. Such the above stacking design can reduces the area of aperture ratio, increases the light receiving area of the sensing element, or increase an capacitance of the storage capacity. Through the evaluation of the required sensing effect or the display aperture ratio of the sensing element, the display device can be designed according to the requirement. The display panel can include liquid crystals, organic light emitting diodes (OLEDs), quantum dots LEDs (QLEDs or QD-LEDs), fluorescent materials, quantum dots, phosphorescent materials, light emitting diodes, micro light emitting diodes (micro-LEDs), mini light emitting diodes (mini-LEDs) or other display mediums, or other display medium, but the disclosure is not limited) between the two substrates. In some embodiments, the chip size of the light emitting diode is about 300 micrometers to 10 millimeters (mm), and the chip size of the mini LED is about 100 micrometers (μm) to 300 micrometers (μm), micro the size of a chip of a micro LED is about 1.

A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. Anyone skilled in the technology field of the invention will be able to make suitable modifications or changes based on the specification disclosed below to meet actual needs without breaching the spirit of the invention. Besides, when it is described that a certain layer is disposed "on" a second layer or a substrate, it may refer to the situation that the certain layer is "directly"

or "indirectly" disposed on the second layer or the substrate. In some cases, there may be another layer interposed between the certain layer and the second layer or the substrate. When it is described that a certain layer "contacts" to a second layer or a substrate, it may refer to the situation that the certain layer "directly contacts" or "indirectly contacts" the second layer or the substrate. In some cases, there may be another layer interposed between the certain layer and the second layer or the substrate. Moreover, ordinal numbers, such as "the first", "the second", and "the third", are used in the specification and claims to modify the components of the claims. The ordinal numbers of claim components do not imply or represent that the said components have any previous ordinal numbers, nor represent the sequence between a particular claim component and another claim component or the sequence of process in a manufacturing method. The ordinal numbers used to clearly distinguish the claim components having the same designations.

Figure 1B:
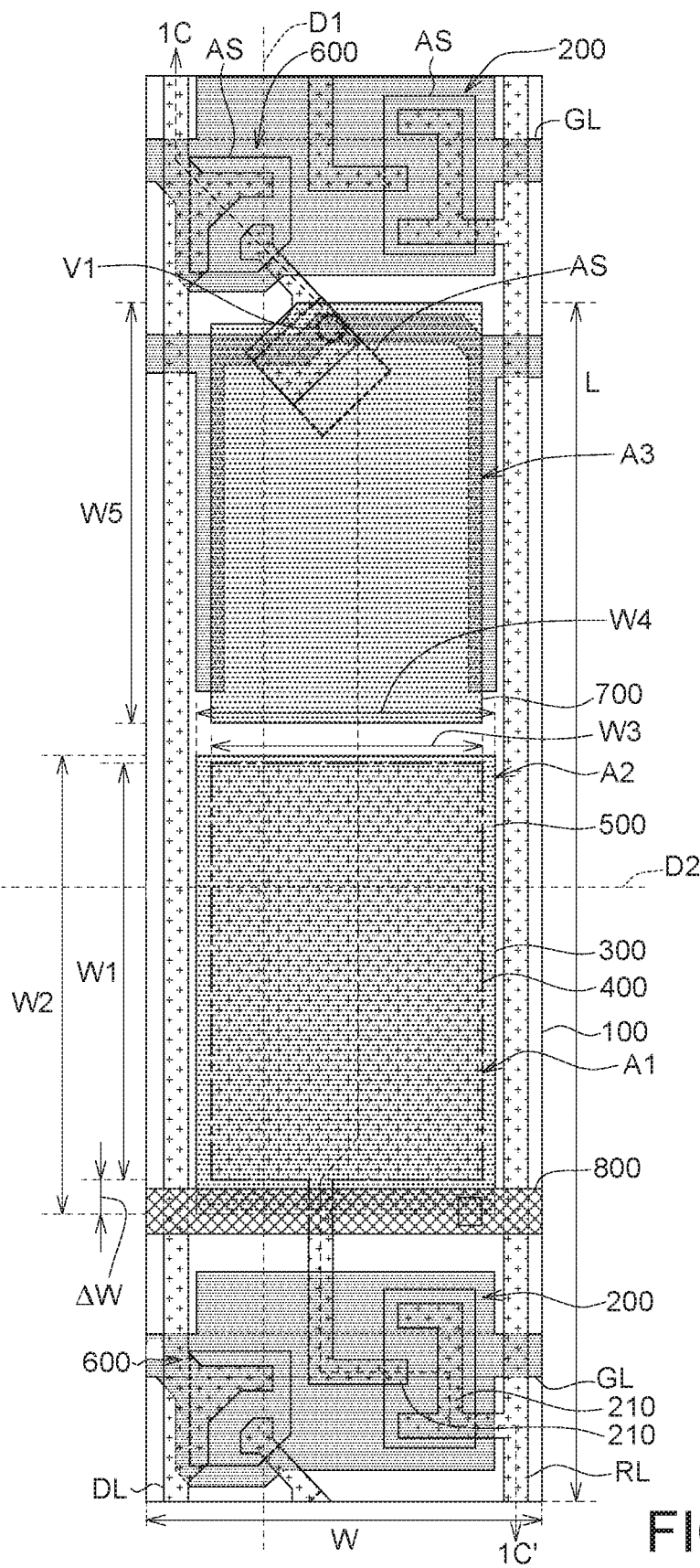
FIG. 1B is a partial top view of a display device according to an embodiment of the present disclosure.
Figure 1C:
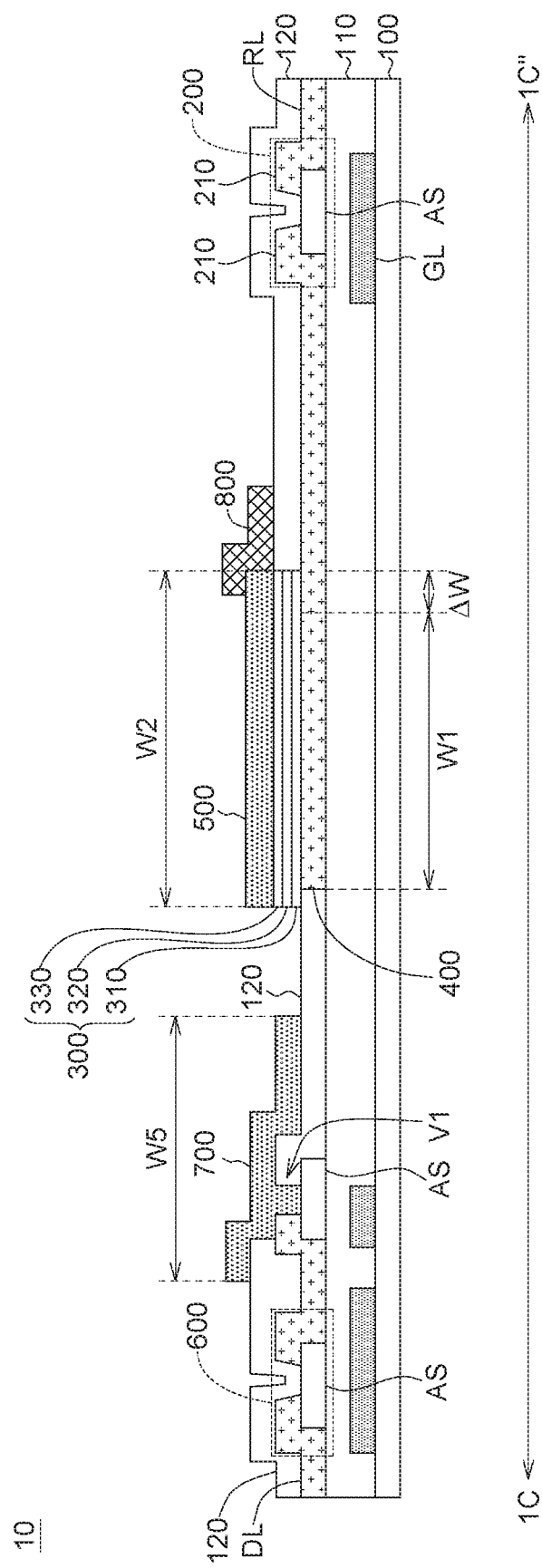
FIG. 1C is a cross-sectional view taken along a tangent line 1C-1C' of FIG. 1B.

FIG. 1A is a top view of a display device according to an embodiment of the present disclosure. FIG. 1B is a partial top view of a display device according to an embodiment of the present disclosure. FIG. 1C is a cross-sectional view taken along a tangent line 1C-1C' of FIG. 1B. It should be noted that some elements are omitted in the drawings, the features of the present disclosure can be more clearly illustrated, the elements are illustrated in the drawings for an illustrative sense only and may not reflect actual sizes or thickness.

As indicated in FIG. 1A, the display device 1 includes a display panel 10. In an embodiment, the display panel 10 has a display region 10A and a peripheral region 10B surrounding the display region 10A.

In an embodiment, FIGS. 1B to 1C schematically illustrate a partial region between two adjacent sub-pixels of the display region 10A of the display panel 10. As indicated in FIGS. 1B to 1C, the display device 1 (the display panel 10) includes a first substrate 100, a first transistor 200, a sensing element 300, a first conductive layer 400 and a second conductive layer 500, the sensing element 300 is disposed in the display region 10A.

As indicated in FIGS. 1B to 1C, the first transistor 200 and the sensing element 300 are disposed on the first substrate 100. The sensing element can be disposed adjacent to and electrically connected to the first transistor 200. The sensing element 300 includes a first-type semiconductor layer 310, an insulation layer 320 and a second-type semiconductor layer 330. The insulation layer 320 is disposed on the first-type semiconductor layer 310, and the second-type semiconductor layer 330 is disposed on the insulation layer 320. In an embodiment, the first-type semiconductor layer 310 and the second-type semiconductor layer 330 can have different conductive types.

As indicated in FIGS. 1B to 1C, the first conductive layer 400 is disposed between the first substrate 100 and the sensing element 300, and the first conductive layer 400 contacts with and electrically connected to the first-type semiconductor layer 310. The second conductive layer 500 is disposed on the sensing element 300, and the second conductive layer 500 contacts with and electrically connected to the second-type semiconductor layer 330. In the present embodiment as indicated in FIGS. 1B to 1C, the first conductive layer 400, the second conductive layer 500 and the insulation layer 320 are stacked to form a storage capacitor. The storage capacitor and the sensing element 300 are electrically connected to each other, the storage capacitor share the same insulation layer 320 with the sensing element 300.

According to the embodiments of the present disclosure, the sensing element 300 is disposed between the first conductive layer 400 and the second conductive layer 500, and the sensing element 300 shares the same insulation layer 320 with the storage capacitor. Through the above design, the storage capacitor and the sensing element 300 do not need to be disposed independently, so the light receiving area or storage capacity of the sensing element 300 can be increased, or the aperture ratio can be increased.

According to some embodiments, the sensing element 300 is an optical sensing element, which can be used for recognizing biological features such as fingerprints, facial prints or palm prints, and the present disclosure is not limited thereto. The first transistor 200 is a switch element of the optical sensing element. The storage capacitor is an optical storage of the optical sensing element. According to some embodiments, the sensing element 300 is disposed in the display region 10A of the display panel 10. The optical element for recognizing biological features is disposed in the display region.

In some embodiments as indicated in FIGS. 1B to 1C, the first transistor 200 further includes a drain (one of the two blocks 210) and a source (the other one of the two blocks 210), wherein the drain, the source and the first conductive layer 400 can be formed of the same layer of conductive material. The drain, the source and the first conductive layer 400 can be formed in the same process. In other embodiments, the first conductive layer 400 and the drain (or the source) can be formed of different layers of conductive material, and the present disclosure is not limited thereto. As indicated in FIGS. 1B to 1C, the first transistor 200 is disposed adjacent to the sensing element 300.

The first transistor 200 further includes an active layer AS disposed between the drain and the source. When a voltage is applied to the active layer AS, an electrical signal can be generated to control the ON/OFF state of the first transistor 200.

As indicated in FIG. 1C, the first-type semiconductor layer 310 can be one of an N-type semiconductor layer and a P-type semiconductor layer; the second-type semiconductor layer 330 can be the other one of the N-type semiconductor layer and the P-type semiconductor layer; and the overlapping area between the first-type semiconductor layer 310 and the insulation layer 320 is equivalent to the overlapping area between the second-type semiconductor layer 330 and the insulation layer 320.

The first-type semiconductor layer 310, the insulation layer 320 and the second-type semiconductor layer 330 are disposed on the first substrate 100 in order, then etching process using the same mask. However, if the first-type semiconductor layer 310, the insulation layer 320 and the second-type semiconductor layer 330 are patterned by different etching processes using different mask, the overlapping area between the first-type semiconductor layer 310 and the insulation layer 320 is not necessarily equivalent to the overlapping area between the second-type semiconductor layer 330 or the insulation layer 320.

Typically, the way of forming the stacked structure by the same etching process can make the manufacturing process easier, or make the first-type semiconductor layer 310, the insulation layer 320 and the second-type semiconductor layer 330 have the same overlapping area. In other words, the sensing element 300 of the embodiments of the present disclosure is a vertically stacked PIN sensor.

In an embodiment, the P-type semiconductor layer may include amorphous silicon doped with a group III element, such as boron, aluminum, tantalum, other suitable elements, or any combination thereof. The N-type semiconductor layer may include amorphous silicon doped with a group V element, such as nitrogen, phosphorus, arsenic, other suitable elements, or any combination thereof. The insulation layer 320 may include amorphous silicon or other suitable materials, and the present disclosure is not limited thereto.

In some embodiments, the first conductive layer 400 may include molybdenum metal, molybdenum alloy, aluminum metal, aluminum alloy, other suitable non-transparent metals or any combination thereof. The second conductive layer 500 may include a transparent conductive material, such as indium-zinc-oxide (IZO), Indium-tin-oxide (ITO), other suitable transparent materials or a combination thereof.

According to the embodiments of the present disclosure, the second conductive layer 500 disposed on the second-type semiconductor layer 330 can include transparent conductive layer having high transmittance of the light. After a light is projected on a biological feature, the light reflected from the biological feature can pass through the second conductive layer 500, and then be received by the sensing element 300. Moreover, the first conductive layer 400 disposed under the first-type semiconductor layer 310 can include reflective metal layer, the first conductive layer 400 can be used to reflect the part of the external light, or Increase the amount of signal detected by the sensing component 300. In other words, the sensing element 300 is disposed between the first conductive layer 400 and the second conductive layer 500, wherein the sensing element 300 and the storage capacitor share the same insulation layer 320. By applying the stacking design, the transmittance of the display panel 10, the light sensing efficiency of the sensing element 300 or the storage capacity of the storage capacitor can be increased. Furthermore, because the first conductive layer 400 disposed under the sensing element 300 has high reflectance, according to the half-reverse principle, the brightness uniformity of the display panel can be increased.

As indicated in FIGS. 1B to 1C, the display panel 10 may further include a via V1, the via V1 passes through the passivation layer 120 and electrically connects the second transistor 600 with the transparent conductive layer 700, the ON/OFF state or the write signal of a pixel can be controlled through the second transistor 600.

As indicated in FIGS. 1B to 1C, the display panel 10 may further include a transmission line 800 disposed on the first substrate 100 and electrically connected to the second conductive layer 500. The transmission line 800 can be used for transmitting signals to the sensing element 300.

In some embodiments, the transmission line 800 may include a conductive material (such as molybdenum metal, molybdenum alloy, aluminum metal, aluminum alloy, IZO, ITO, suitable conductive material, or any combination thereof). In some embodiments, the transmission line 800 can include a transparent conductive material, such that the loss of aperture ratio can be reduced.

As indicated in FIGS. 1B to 1C, in the top view direction from the first substrate 100, the first conductive layer 400 and the insulation layer 320 have a first overlapping width W1, and the second conductive layer 500 and the insulation layer 320 have a second overlapping width W2. In an embodiment, the first overlapping width W1 can be less than or equivalent to the second overlapping width W2. In the embodiment as indicated in FIGS. 1B to 1C, the first overlapping width W1 is less than the second overlapping width W2. The first overlapping width W1 can be defined as a width of an overlapping portion disposed between the first conductive layer 400 and the insulation layer 320 on a tangent line D1, the tangent line D1 can be defined as a direction parallel to an extension direction of the data line DL. The second overlapping width W2 can be defined as a width of an overlapping portion disposed between the second conductive layer 500 and the insulation layer 320 on a tangent line D1.

As indicated in FIG. 1B, the first conductive layer 400 and the insulation layer 320 have a third overlapping width W3 on the tangent line D2, the tangent line D2 is perpendicular to the tangent line D1, or the tangent line D2 can be defined as the tangent line parallel to the gate line GL. The second conductive layer 500 and the insulation layer 320 have a fourth overlapping width W4 on the tangent line D2. In an embodiment, the third overlapping width W3 can be less than or equivalent to the fourth overlapping width W4. In the embodiment as indicated in FIG. 1B, the third overlapping width W3 is less than the fourth overlapping width W4. In some embodiments, the first conductive layer 400, the data line DL and the read-out line RL are formed of the same layer. In this case, a third overlapping width W3 is less than the fourth overlapping width W4 to provide a sufficient gap between the first conductive layer 400 and the data line DL (or the read-out line RL), the sufficient gap is disposed on two sides of the first conductive layer 400 to reduce the probability of short circuit. In some other embodiments, the insulation layer 320 or the second conductive layer 500 can have an equal width, as long as the first conductive layer 400 is separated from the data line DL or the read-out line R by a sufficient gap, the third overlapping width W3 can be equivalent to the fourth overlapping width W4.

As indicated in FIG. 1B, the first overlapping area A1 can be defined as the overlapping area between the first conductive layer 400 and the insulation layer 320 in a normal direction of the first substrate 100. The second overlapping area A2 can be defined as the overlapping area between the second conductive layer 500 and the insulation layer 320 in the normal direction of the first substrate 100. In an embodiment, the first overlapping area A1 is less than or equivalent to the second overlapping area A2. In some embodiments, the first overlapping area A1 and the second overlapping area A2 can have different shapes such as squares, rectangles, polygons, or other suitable patterns, and the present disclosure is not limited thereto. In the embodiment as indicated in FIG. 1B, the first overlapping area A1 is less than the second overlapping area A2, and both the first overlapping area A1 and the second overlapping area A2 are rectangles.

According to the embodiments of the present disclosure, the portions of the first conductive layer 400, the insulation layer 320 and the second conductive layer 500 overlapping with each other can be combined to form a storage capacitor, the area can be defined as the overlapping area formed by the first overlapping area A1 and the second overlapping area A2.

In the embodiments as indicated in FIGS. 1B to 1C, In the top view direction from the first substrate 100, the first-type semiconductor layer 310, the insulation layer 320, the second-type semiconductor layer 330 and the second conductive layer 500 almost overlap with each other, and the area of the sensing element 300 is equivalent to the area of the second overlapping area A2. This structure can be implemented by the processing steps described as follows: The first-type semiconductor layer 310, the insulation layer 320, the second-type semiconductor layer 330, and the second conductive layer 500 are disposed on the first substrate 100 in sequence to form a stacked structure, and then the stacked structure can be pattered by the same etching process using same mask. In the embodiments as indicated in FIGS. 1B to 1C, the second overlapping area A2 can be larger than or equivalent to the first overlapping area A1, so that the area of the storage capacitor is approximately equivalent to the area of the first overlapping area A1.

As indicated in FIGS. 1B to 1C, the display panel 10 may further include a read-out line RL electrically connected to the first transistor 200 for reading the signals of the sensing element 300.

As indicated in FIGS. 1B to 1C, the display panel 10 may further include a second transistor 600 and a transparent conductive layer 700. The second transistor 600 is disposed on the first substrate 100, and the second transistor 600 corresponds to the display region 10A. The transparent conductive layer 700 is correspondingly disposed in a light penetrating region A3 of the display region 10A. The transparent conductive layer 700 is not overlapped with the sensing element 300. The second transistor 600 is electrically connected to the transparent conductive layer 700. The transparent conductive layer 700 has a width measured along an extension direction of the data line DL, the first conductive layer 400 and the insulation layer 320 have a first overlapping width W1 measured along the extension direction of the data line DL, a ratio of the width of the transparent conductive layer 700 to the first overlapping width W1 is in a range from 1 to 3.5. As indicated in FIGS. 1B to 1C, the light penetrating region A3 and the sensing element 300 are adjacent to each other. As indicated in FIGS. 1B to 1C, the transparent conductive layer 700 has a width W5 on the first substrate 100 measured along the extension direction of the data line DL. The ratio of the width W5 to the first overlapping width W1 is about 1:1 (W5:W1=1:1).

In some embodiments, the second transistor 600 can be realized by such as a display switch element of the display panel 10; the second transistor 600 can be a top gate type thin-film transistor (TFT) or a bottom gate TFT. In the embodiments as indicated in FIGS. 1B to 1C, the second transistor 600 can be a bottom gate TFT. Meanwhile, another substrate (such as a color filter substrate) of the display panel 10 (not illustrated) corresponding to the first substrate 100, the color filter substrate can have a black matrix (BM) layer to block the light passing through the front surface of the display panel from entering into the second transistor 600, and reduce current leakage.

As indicated in FIG. 1C, the display panel 10 may further include a dielectric layer 110 disposed on the first substrate 100.

As indicated in FIG. 1C, the display panel 10 may further include a passivation layer 120 disposed on the dielectric layer 110. The passivation layer 120 can also be disposed on the first transistor 200 and the second transistor 600, and the present disclosure is not limited thereto.

In the embodiment as indicated in FIG. 1B, the sub-pixel region has a length L about 180 micrometers (μm) and a width W about 60 μm, and the sub-pixel region is defined by the length L and the width W. Let the area ratio of a sub-pixel region be defined as 100%, the area ratio of the sensing element 300 is about 30.22%, the area ratio of the storage capacitor is about 25.06%, and the area ratio of the opening region is about 19.83%. The calculation of the area ratio of the opening region is as follows: The area ratio of the remaining area being 50.04% is obtained by deducting the area ratio of all traces (such as the data line DL and the read-out line RL), the area ratio of the opening region being 19.83% is obtained by deducting the area ratio of the sensing element 300 being 30.22% from the area ratio of the remaining area being 50.04%. Since the area of the storage capacitor is substantially equivalent to or slightly less than the area of the sensing element 300, and the storage capacitor is included in the area of the sensing element 300, thus the sensing element 300 does not occupy extra area of the opening region.

In contrast, the optical sensing element and the storage capacitor involved in a traditional optical display device normally are independently disposed on the first substrate 100. In other words, the optical sensing element and the storage capacitor are disposed in different regions of sub-pixels. In order to achieve an opening region whose area is similar to that indicated in FIGS. 1B to 1C of the present disclosure, the sum of the area ratio of the optical sensing element and the area ratio of the storage capacitor should be controlled approximately equivalent to the area ratio of the sensing element 300 being 30.22%. It means that, either the area ratio of a single optical sensing element or the area of a single storage capacitor need to be less than 30.22% to satisfy the area requirement in the opening region. However, since the storage capacitor requires a minimum area ratio (such as 19%), thus the area ratio of the remaining optical sensing element after deducting the minimum requirement of area ratio of the storage capacitor, the light receiving region of the optical sensing element may be very small that can cause poor light sensing capacity or cannot achieve a satisfactory effect for recognizing biological features. Moreover, the traditional stacking transistor design of the optical sensing element may not be capable for applying a transflective mode to increase the backlight brightness, whereby the brightness uniformity of the traditional optical display device may be unsatisfactory.

According to the embodiments of the present disclosure, the sensing element 300 and the storage capacitor share the same insulation layer 320, so the sensing element 300 and the storage capacitor are overlapped with each other, the sensing element 300 and the storage capacitor can occupy a large area ratio of the sub-pixel region according to the requirements of the product without excluding one another. Since the sensing element 300 and the storage capacitor have common structure, In the top view direction from the display panel, the sensing element 300 and the storage capacitor occupy almost the same area of the aperture ratio and substantially overlap each other, thus this arrangement of the sensing element 300 and the storage capacitor do not need to occupy extra area of the opening region. Moreover, when the first conductive layer 400 of the storage capacitor is realized by a reflective metal layer, the first conductive layer 400 can reflect the light source to increase the overall backlight brightness or increase the brightness uniformity of the display panel.

Figure 2A:
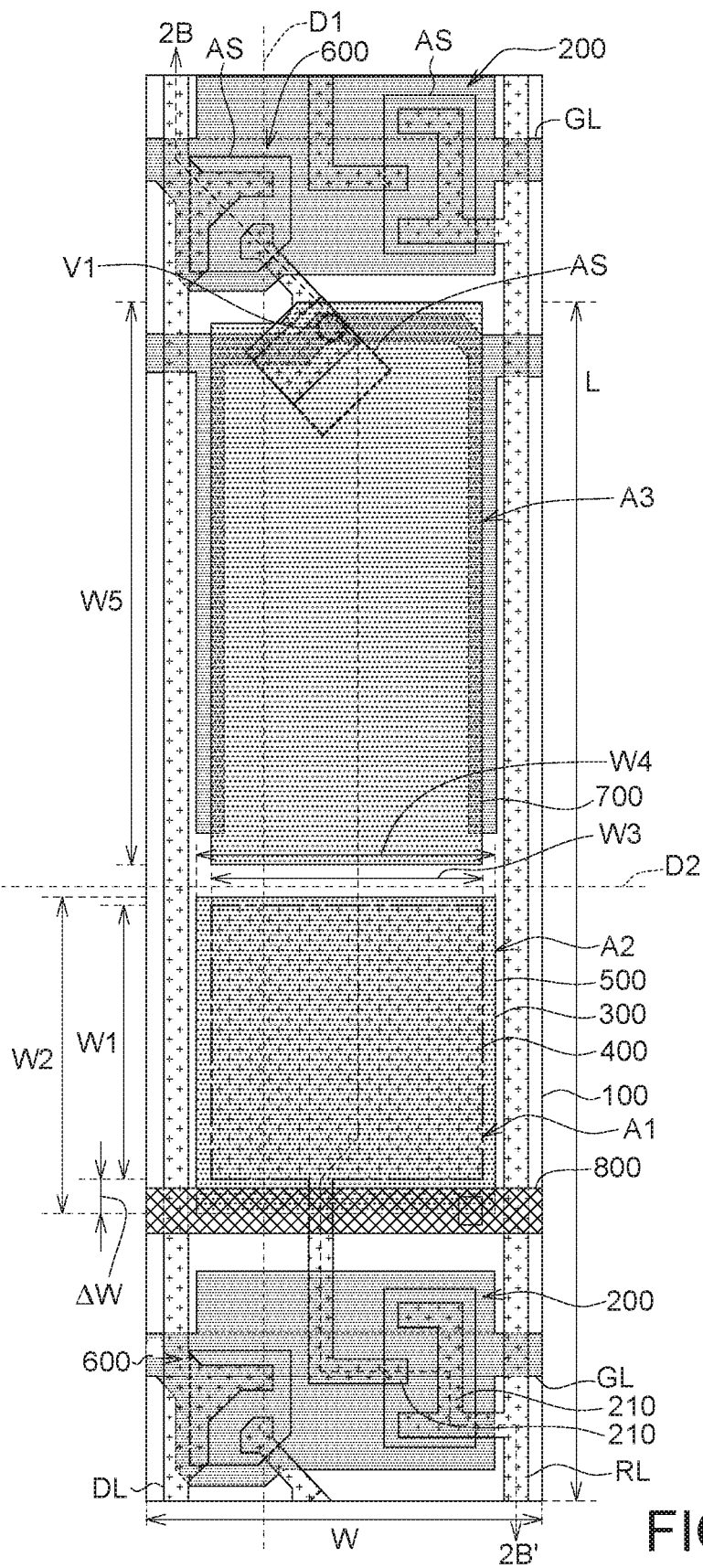
FIG. 2A is a partial top view of a display device according to another embodiment of the present disclosure.
Figure 2B:
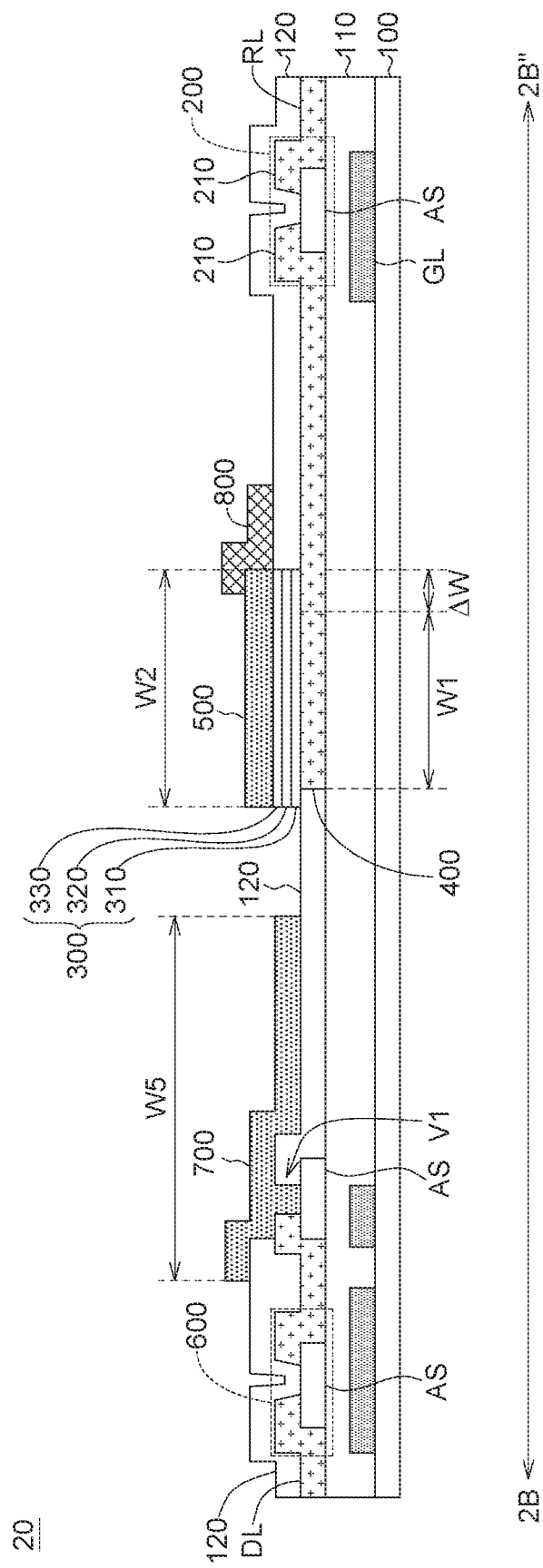
FIG. 2B is a cross-sectional view taken along a tangent line 2B-2B' of FIG. 2A.

FIG. 2A is a partial top view of a display device according to another embodiment of the present disclosure. FIG. 2B is a cross-sectional view taken along a tangent line 2B-2B' of FIG. 2A. For elements of the present embodiment similar or identical to that of above embodiments, similar or identical designations are used. Relevant descriptions of similar or identical elements which can be obtained with reference to above disclosure are not repeated here.

The present embodiment is different from above embodiments in that, as indicated in FIGS. 2A to 2B, in a partial display region of the display device of the display panel 20 of the present disclosure, the width W5 of the transparent conductive layer 700 is increased, but the first overlapping width W1 is reduced. For example, the ratio of the width W5 to the first overlapping width W1 is about 2.5:1 (W5:W1=2.5:1).

In an embodiment as indicated in FIGS. 2A to 2B, the sub-pixel region has a length L about 180 µm and a width W about 60 µm. Let the area of a sub-pixel region be defined as 100%, the area ratio of the sensing element 300 is about 19.70%, the area ratio of the storage capacitor is about 15.54%, and the area ratio of the opening region is about 30.34%. The calculation of the area ratio of the opening region is the same all through the specification. The area ratio of the remaining area being 50.04% is obtained by deducting the area ratio of all traces, the area ratio of the opening region being 30.34% is obtained by deducting the area ratio of the sensing element 300 being 19.70% from the area ratio of the remaining area being 50.04%. Since the sensing element 300 and the storage capacitors has common structure. In the top view direction from the display panel, the sensing element 300 and the storage capacitor occupy almost the same area of the aperture ratio and substantially overlap each other, thus this arrangement of the sensing element 300 and the storage capacitor do not need to occupy extra area of the opening region.

In an embodiment, the ratio W5/W1 of the width W5 to the first overlapping width W1 is increased (such as to be larger than 1). Based on the stacking design of the sensing element 300 and the storage capacitor according to the embodiments of the present disclosure, the aperture ratio of the display panel can be increased while the light receiving area and the light receiving capacity can be remained in sufficient.

Figure 3A:
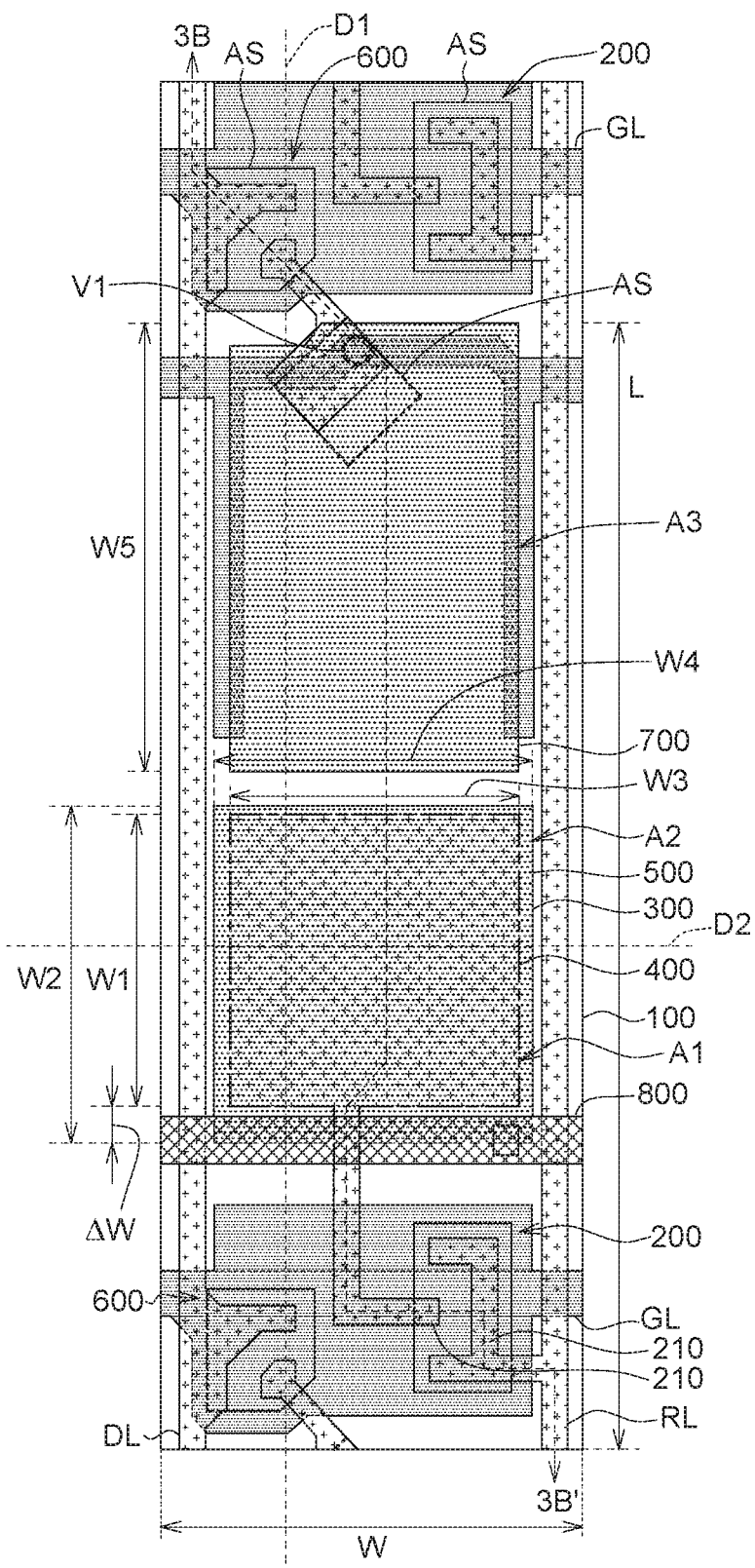
FIG. 3A is a partial top view of a display device according to another embodiment of the present disclosure.
Figure 3B:
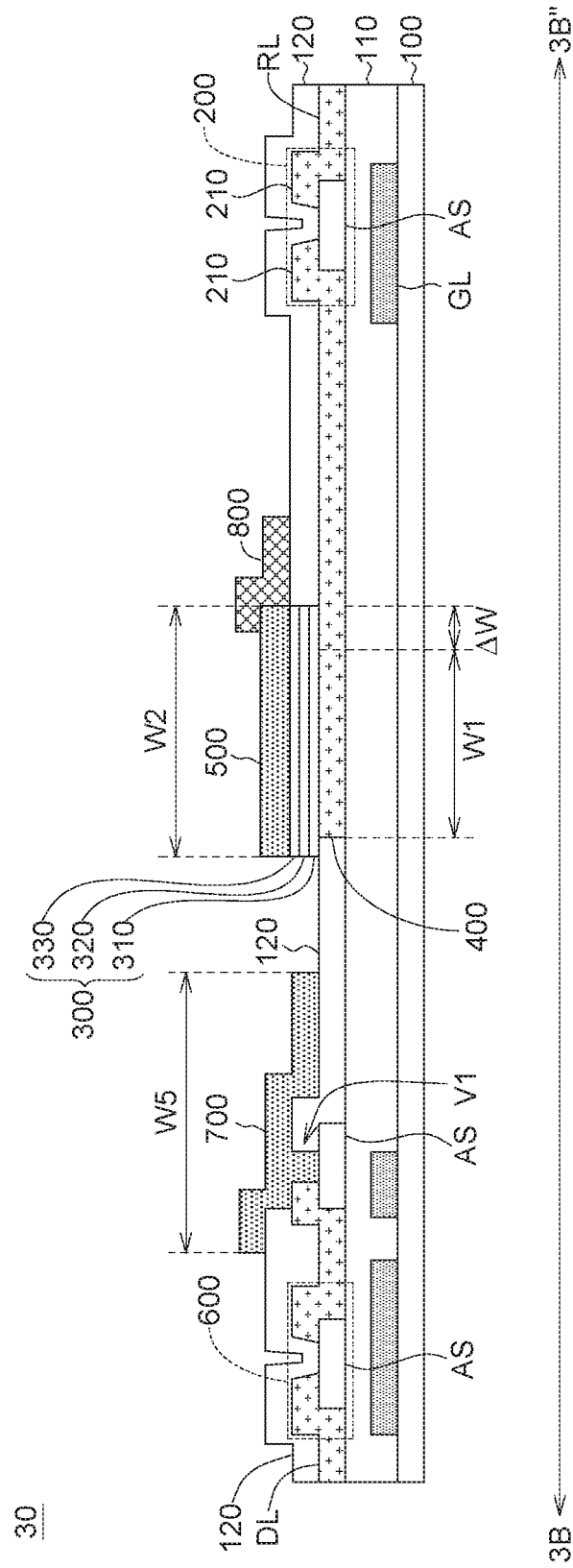
FIG. 3B is a cross-sectional view along a tangent line 3B-3B' of FIG. 3A.

FIG. 3A is a partial top view of a display device according to another embodiment of the present disclosure. FIG. 3B is a cross-sectional view taken along a tangent line 3B-3B' of FIG. 3A. For elements of the present embodiment similar or identical to that of above embodiments, similar or identical designations are used. Relevant descriptions of similar or identical elements which can be obtained with reference to above disclosure are not repeated here.

In a partial display region of the display panel 30 of the present disclosure, the width W5 of the transparent conductive layer 700 of the embodiments as indicated in FIGS. 3A to 3B is equivalent to the width W5 of the transparent conductive layer 700 of the embodiments as indicated in FIGS. 1B to 1C. The first overlapping width W1 of the present embodiment is different from the first overlapping width W1 of the embodiments as indicated in FIGS. 2A to 2B mainly in that the length L of the sub-pixel region is reduced to 154 µm, but the width W remains at 60 µm, the area of a sub-pixel region is reduced.

Refer to the embodiment as indicated in FIGS. 3A to 3B. Let the area of a sub-pixel region be defined as 100%. Then, the area ratio of the sensing element 300 is about 22.79%, the area ratio of the storage capacitor is about 18.17%, and the area ratio of the opening region is about 23.44%. The calculation of the area ratio of the opening region is the same all through the specification. The area ratio of the remaining area being 46.23% is obtained by deducting the area ratio of all traces, the area ratio of the opening region being 23.44% is obtained by deducting the area ratio of the sensing element 300 being 22.79% from the area ratio of the remaining area being 46.23%. Since the sensing element 300 and the storage capacitors have common structure. In the top view direction from the display panel, the sensing element 300 and the storage capacitor occupy almost the same area of the aperture ratio and substantially overlap each other, thus this arrangement of the sensing element 300 and the storage capacitor do not need to occupy extra area of the opening region.

In an embodiment, when the length L of the sub-pixel region is reduced (for example, the length L of the sub-pixel region is reduced from 180 µm to 154 µm), based on the stacking design of the sensing element 300 and the storage capacitor according to the embodiments of the present disclosure, the display resolution can be increased to 287 ppi from 278 ppi by reducing the area of a single sub-pixel region without reducing of the aperture ratio of the display panel. Meanwhile, the light receiving area (the area ratio of the sensing element 300) and the light receiving capacity can be sufficient.

Figure 4A:
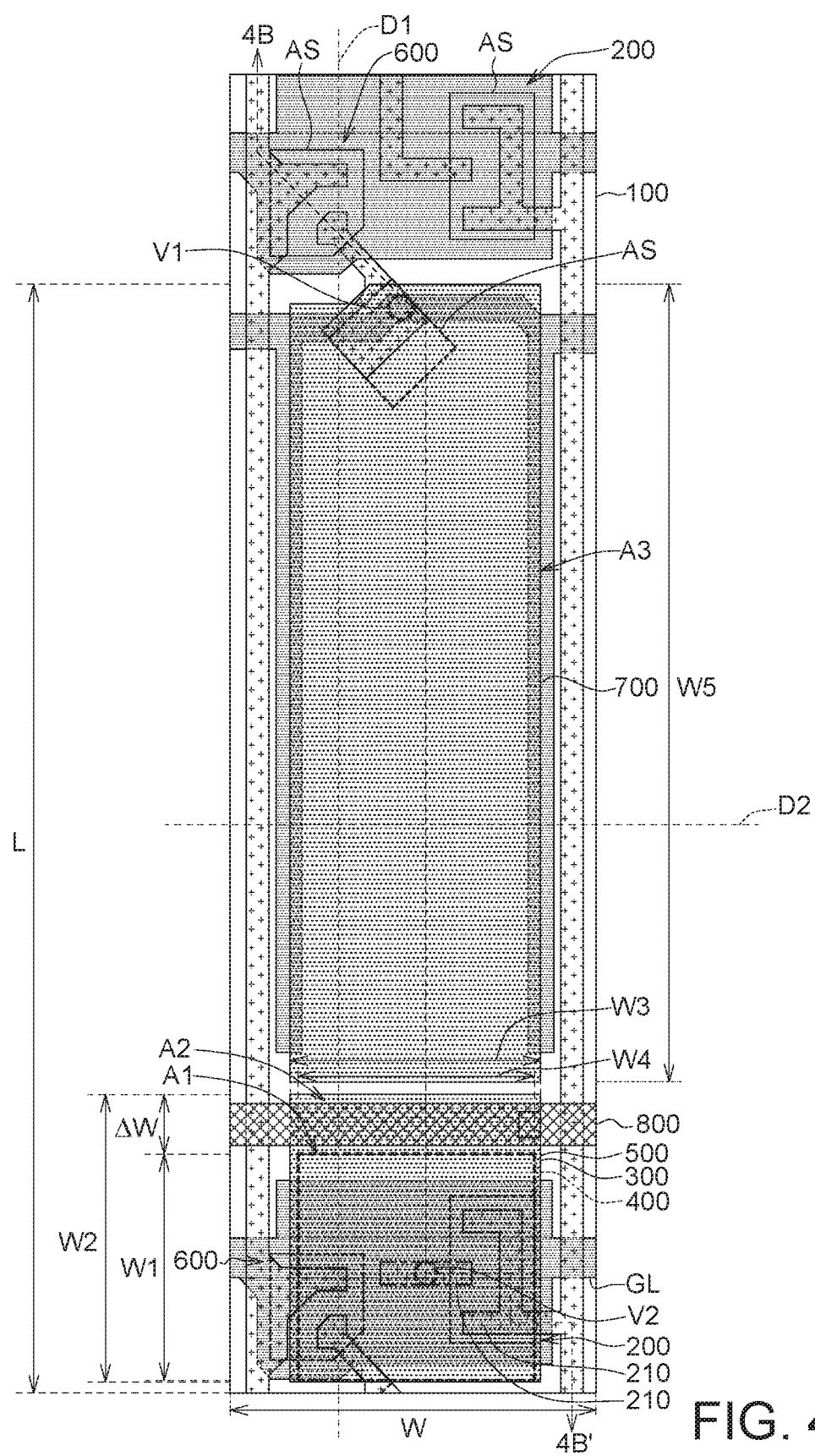
FIG. 4A is a partial top view of a display device according to another embodiment of the present disclosure.
Figure 4B:
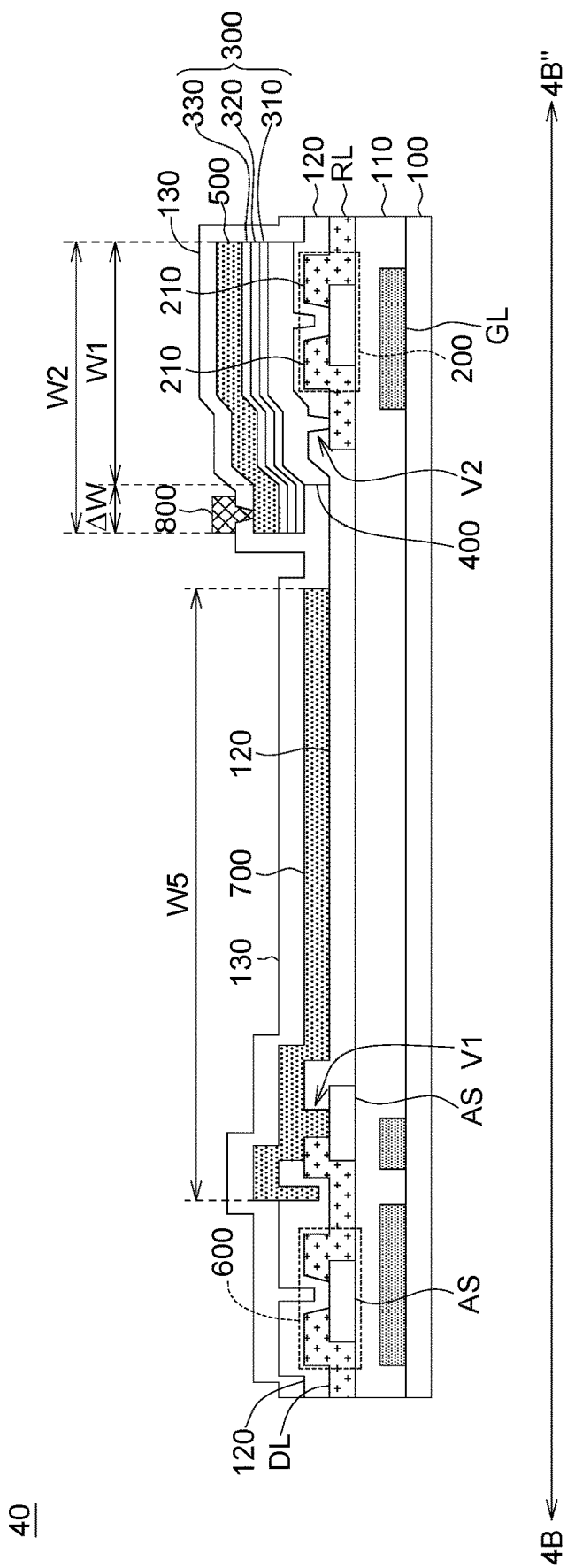
FIG. 4B is a cross-sectional view taken along a tangent line 4B-4B' of FIG. 4A.

FIG. 4A is a partial top view of a display device according to another embodiment of the present disclosure. FIG. 4B is a cross-sectional view taken along a tangent line 4B-4B' of FIG. 4A. For elements of the present embodiment similar or identical to that of above embodiments, similar or identical designations are used. Relevant descriptions of similar or identical elements which can be obtained with reference to above disclosure are not repeated here.

The present embodiment is different from above embodiments in that: in a partial display region of the display device of the display panel 40 of the present embodiment as indicated in FIGS. 4A to 4B, the sensing element 300 can be partly disposed on the first transistor 200. In the top view direction from the first substrate 100, the sensing element 300 at least partly or even completely overlaps with the first transistor 200.

As indicated in FIGS. 4A to 4B, the sensing element 300, the first conductive layer 400 and the second conductive layer 500 is disposed on the first transistor 200, the sensing element 300 is disposed between the first conductive layer 400 and the second conductive layer 500, and the sensing element 300 and the storage capacitor share the same insulation layer 320.

As indicated in FIGS. 4A to 4B, the display panel 40 may further include a via V2, wherein the via V2 passes through the passivation layer 120 and electrically connects the first conductive layer 400 with the first transistor 200, such that the ON/OFF state of the sensing element 300 can be controlled through the first transistor 200.

In the embodiment as indicated in FIGS. 4A to 4B, the sensing element 300 is disposed on the first transistor 200, the first transistor 200 and shares the insulation layer 320 with the storage capacitor. In the top view direction from the first substrate 100, the sensing element 300 and the storage capacitor occupy almost the same area of the aperture ratio, and the sensing element 300 and the storage capacitor substantially overlap each other. Furthermore, since the sensing element 300 is disposed on the first transistor 200, thus the first transistor 200 does not need to occupy extra area of the opening region (the area occupied by the first transistor 200 can be less than that occupied by the storage capacitor). By applying this arrangement, the area of the opening region can be increased.

In some embodiments as indicated in FIG. 4A, the sensing element 300 can partly cover the second transistor 600. A cross-sectional view showing the sensing element 300 partly covering the second transistor 600 can be obtained with reference to FIG. 5B.

In an embodiment as indicated in FIGS. 4B to 4C, the sub-pixel region has a length L about 180 µm and a width W about 60 µm. Let the area of a sub-pixel region be defined as 100%. Then, the area ratio of the sensing element 300 is about 19.7%, the area ratio of the storage capacitor is about 13.98%. In the top view direction from the first substrate 100, the sensing element 300, the first transistor 200 and the second transistor 600 overlap each other. The calculation of the area ratio of the opening region is as follows. The area ratio of the opening region is the area ratio of the remaining area being 50.04% which is obtained by deducting the area ratio of all traces. The stacking design of the sensing element 300 and the storage capacitor according to the embodiments of the present disclosure provides sufficient light receiving area and sufficient light receiving capacity, or increases the aperture ratio of the display panel.

In the embodiment as indicated in FIGS. 4B to 4C, the sensing element 300 is disposed on the first transistor 200. The ratio W5/W1 of the width W5 to the first overlapping width W1 is increased to, for example, 3.5.

As disclosed above, the sensing element 300 may at least partly overlap the first transistor 200. As indicated in FIGS. 4A to 4B, the first transistor 200 further includes a drain (one of the two blocks 210) and a source (the other one of the two blocks 210), the first conductive layer 400 is disposed on the drain and the source, and the first conductive layer 400 is electrically connected to the drain and the source through a via. As indicated in FIGS. 4A to 4B, the display panel 40 further includes an insulation layer 130. A transmission line 800 is disposed on the sensing element 300 and electrically connected to the second conductive layer 500. The transmission line 800 can be used for transmitting signals to the sensing element 300.

In the embodiment as indicated in FIG. 4A, the sensing element 300 is disposed in the region of one of two adjacent sub-pixels. In other words, the sensing element 300 is not necessarily disposed in all sub-pixel regions of the display region of the display panel.

Figure 5A:
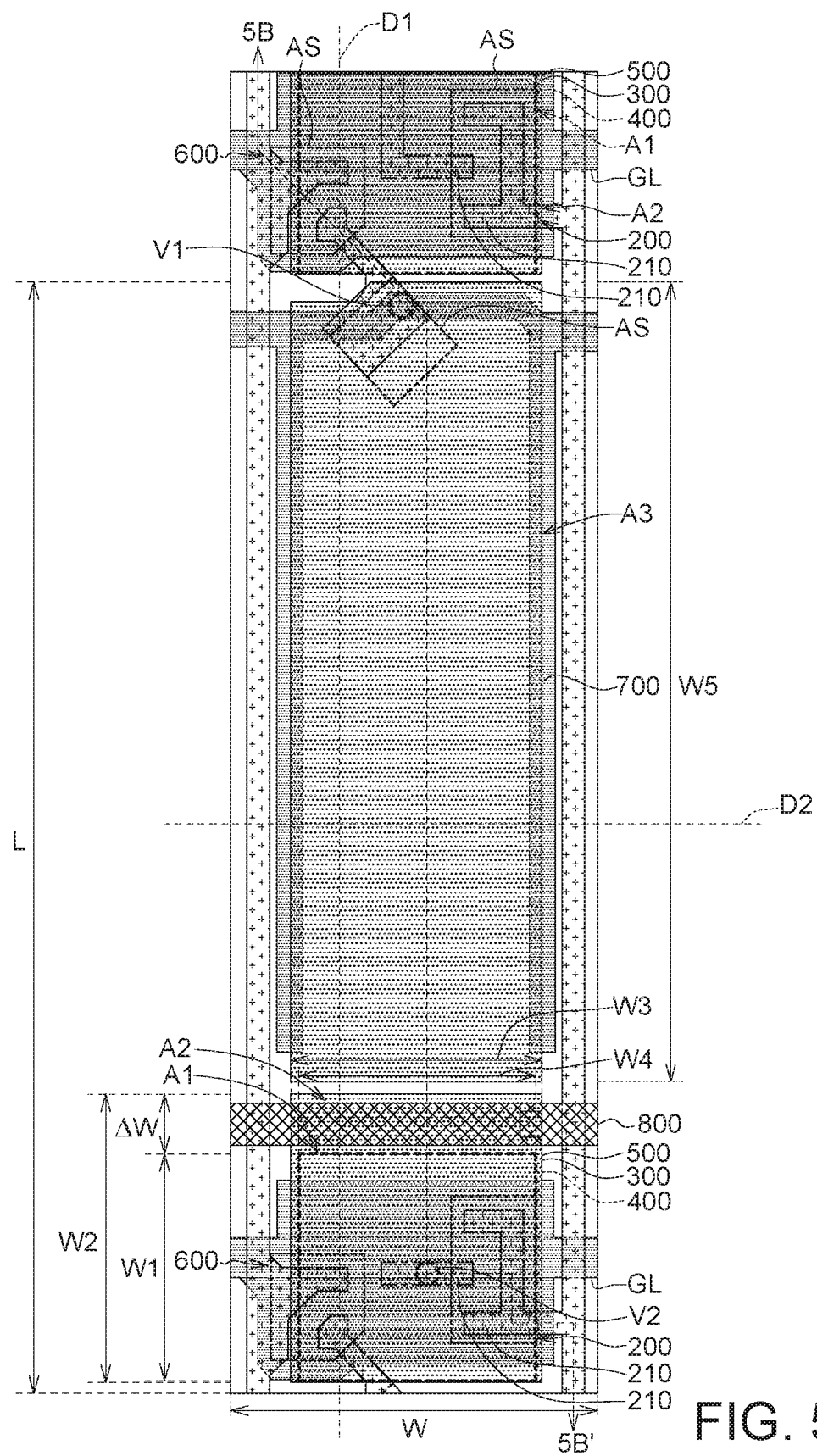
FIG. 5A is a partial top view of a display device according to another embodiment of the present disclosure.
Figure 5B:
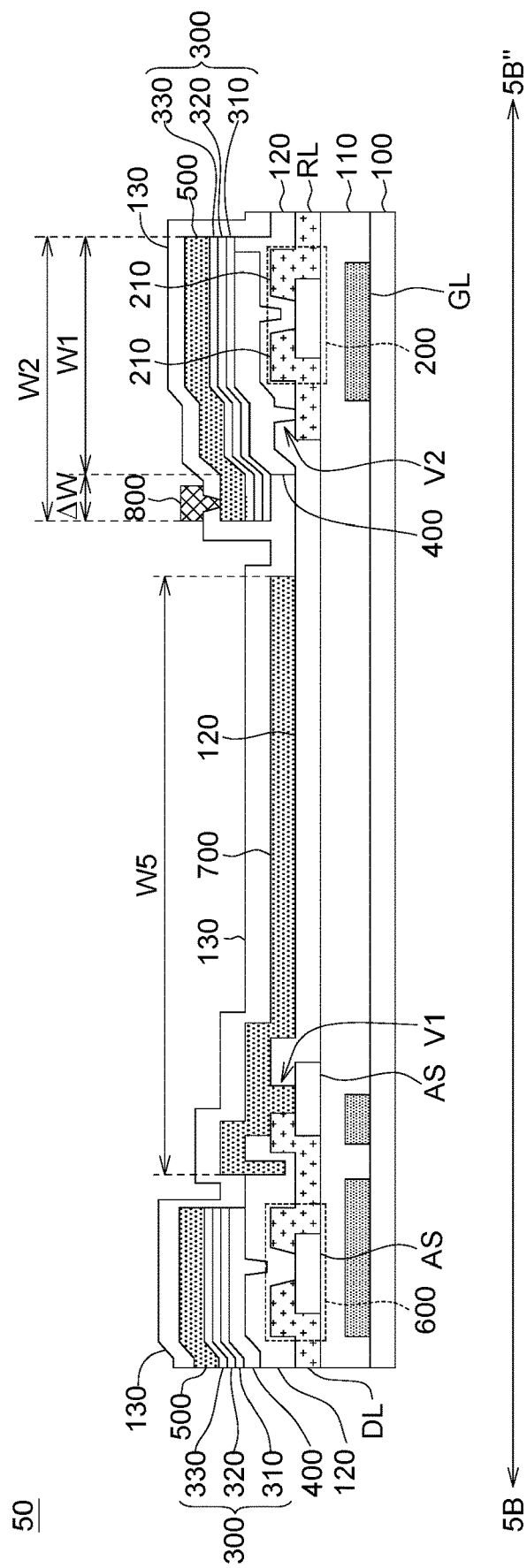
FIG. 5B is a cross-sectional view taken along a tangent line 5B-5B' of FIG. 5A.

FIG. 5A is a partial top view of a display device according to another embodiment of the present disclosure. FIG. 5B is a cross-sectional view taken along a tangent line 5B-5B' of FIG. 5A. For elements of the present embodiment similar or identical to that of above embodiments, similar or identical designations are used. Relevant descriptions of similar or identical elements which can be obtained with reference to above disclosure are not repeated here.

The present embodiment is different from above embodiments in that, as indicated in FIGS. 5B to 5B, in a partial display region of the display device of the display panel 50 of the present disclosure, the corresponding first transistor 200 can partly overlap two sensing elements 300 of two adjacent sub-pixel regions or the second transistor 600.

In the embodiment as indicated in FIG. 5B, the sensing element 300 can partly overlap the second transistor 600. As indicated in FIG. 5B, the sensing element 300, the first conductive layer 400 and the second conductive layer 500 can all be disposed on the first transistor 200 or the second transistor 600. The sensing element 300 is disposed between the first conductive layer 400 and the second conductive layer 500. The sensing element 300 and the storage capacitor share the same insulation layer 320.

In an embodiment as indicated in FIGS. 5A to 5B, the sensing element 300 is disposed on the first transistor 200 or the second transistor 600, and shares the insulation layer 320 with the storage capacitor. In the top view direction from the first substrate 100, the sensing element 300 and the storage capacitor occupy almost the same area of the aperture ratio and substantially overlap each other. Furthermore, the first transistor 200 or the second transistor 600 has the sensing element 300 disposed thereon, and therefore does not need to occupy extra area of the opening region (the area occupied by the first transistor 200 and the second transistor 600 can be less than the area occupied by the storage capacitor). By applying the arrangement, the storage capacity of the storage capacitor, the sensing effect of the sensing element 300, or the area of the aperture ratio can be increased.

In an embodiment as indicated in FIGS. 5B to 5B, the sub-pixel region has a length L about 180 μm and a width W about 60 μm, and the area ratio of the sensing element 300, the area ratio of the storage capacitor and the area ratio of the opening region are identical to the area of the embodiments indicated in FIGS. 4A to 4B.

Figure 6:
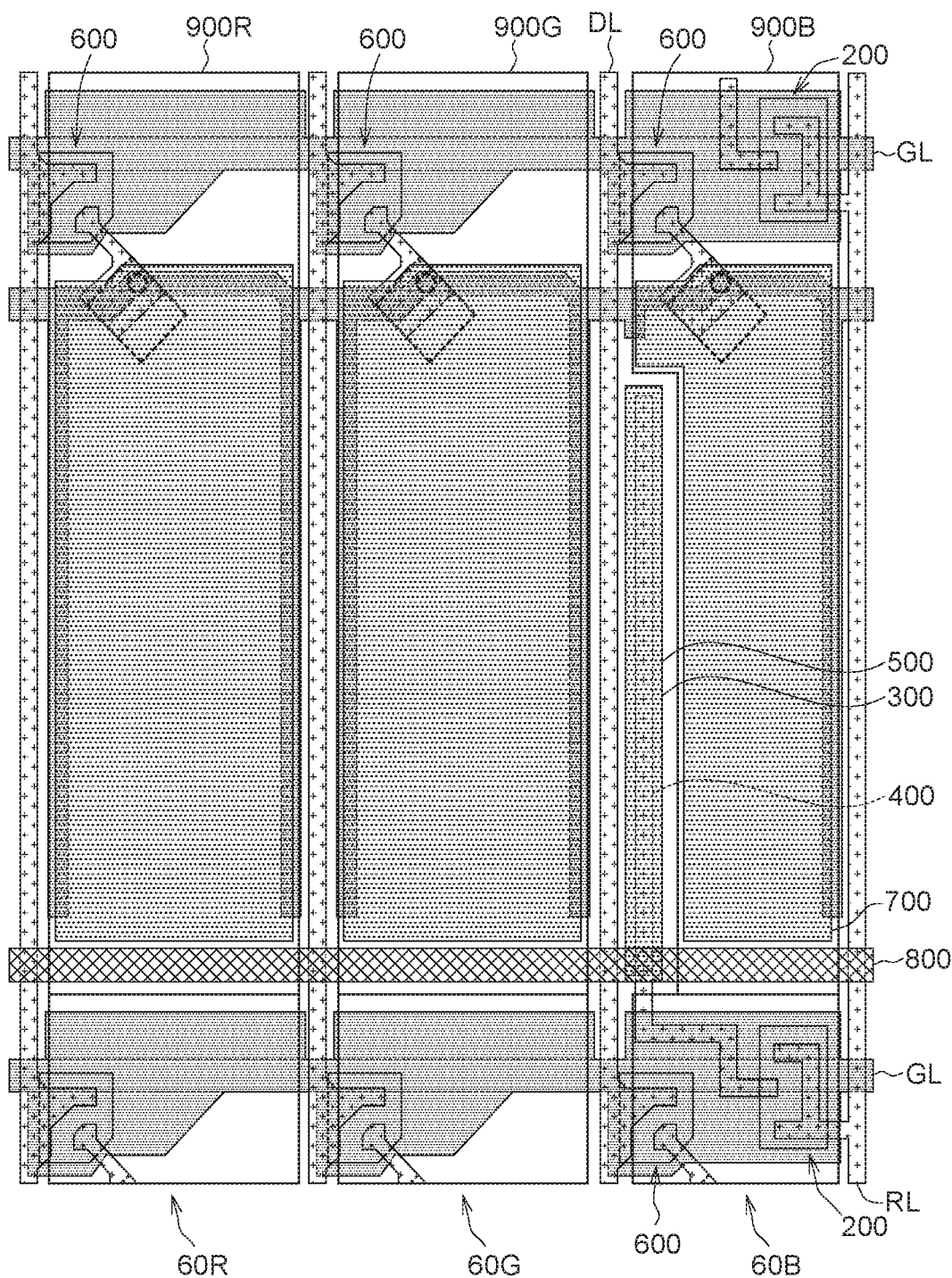
FIG. 6 is a top view of a pixel region of a display device according to an embodiment of the present disclosure.

FIG. 6 is a top view of a pixel region of a display device according to an embodiment of the present disclosure. For elements of the present embodiment similar or identical to that of above embodiments, similar or identical designations are used. Relevant descriptions of similar or identical elements which can be obtained with reference to above disclosure are not repeated here.

The display region has at least one pixel region composed of at least three sub-pixel regions (the RGB sub-pixel regions or the WRGB sub-pixel regions), wherein the sensing element 300 is disposed on at least one of the at least three sub-pixel regions.

In an embodiment, the display panel 60 has a pixel region composed of three sub-pixel regions (such as sub-pixel regions 60R, 60G and 60B). The sensing element 300 is disposed in at least one of the three sub-pixel regions. In some embodiments, the sensing element 300 is disposed on one of the three sub-pixel regions, such that the aperture ratio can be increased.

As indicated in FIG. 6, the display panel 60 includes a color filter (not illustrated). The color filter includes multiple different color blocks 900R, 900G and 900B, which are correspondingly disposed on the three sub-pixel regions 60R, 60G and 60B, respectively. In an embodiment, the color block 900R is a red block, the color block 900G is a green block, and the color block 900B is a blue block.

As indicated in FIG. 6, the sensing element 300 is disposed in the sub-pixel region 60B, the sensing element 300 is disposed adjacent to the data line DL, and the sensing element 300 extends along is the extension direction of the data line DL. The shape of the sensing element 300 is not subjected to specific restrictions, or can be adapted to fit the needs of the products. In the top view direction from the first substrate 100, the shape of the sensing element 300 can include rectangle, rhombus, polygon, or arc, but not limited to this. The second conductive layer 500 is disposed on the sensing element 300, and the second conductive layer 500 contacts with and electrically connected to the sensing element 300.

Refer to the embodiment as indicated in FIG. 6. Let the area of a sub-pixel region 60B be defined as 100%. Then, the area ratio of the sensing element 300 is about 9.22%, the area ratio of the storage capacitor is about 4.25%, and the area ratio of the opening region is about 40.82%. The calculation of the area ratio of the opening region is the same all through the specification. The area ratio of the remaining area being 50.04% is obtained by deducting the area ratio of all traces, the area ratio of the entire sub-pixel region being 100%. Then, the area ratio of the opening region being 40.82% is obtained by deducting the area ratio of the sensing element 300 being 9.22% from the area ratio of the remaining area being 50.04%. Since the area occupied by the storage capacitor is within the area occupied by the sensing element 300, the area ratio of the opening region is not reduced.

In the embodiment as indicated in FIG. 6, the sensing element 300 and the stacked storage capacitor are disposed on the lateral sides of the sub-pixel region 60B. In some other embodiments, the sensing element 300 and the stacked storage capacitor can be disposed on the sub-pixel region 60R or the sub-pixel region 60B. The arrangement of the sensing element 300 can be adapted to fit the transmittance of the photoresist properties of the products. When the sensing element 300 is placed in a sub-pixel region having higher transmittance, the display can increase opportunity to uniform distribution of brightness.

Besides, the sensing element 300 can be disposed in any position of a sub-pixel region as long as the sensing element 300 or the storage capacitor do not overlap with the data line DL.

While the invention has been described by way of example and in terms of the preferred embodiment (s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
  a display panel, comprising:
  a first substrate;
  a first transistor disposed on the first substrate;
  a sensing element disposed on the first substrate and electrically connected to the first transistor, wherein the sensing element comprises:
  a first-type semiconductor layer;
  an insulation layer disposed on the first-type semiconductor layer; and
  a second-type semiconductor layer disposed on the insulation layer;
  a first conductive layer disposed between the first substrate and the sensing element, the first conductive layer contacting with and electrically connected to the first-type semiconductor layer; and
  a second conductive layer disposed on the sensing element, the second conductive layer contacting with and electrically connected to the second-type semiconductor layer;
  wherein the first conductive layer, the second conductive layer and the insulation layer are stacked to form a storage capacitor, and the storage capacitor shares the insulation layer with the sensing element.

2. The display device according to claim 1, wherein the first-type semiconductor layer is one of an N-type semiconductor layer and a P-type semiconductor layer, the second-type semiconductor layer is the other one of the N-type semiconductor layer and the P-type semiconductor layer, and an overlapping area between the first-type semiconductor layer and the insulation layer is equivalent to an overlapping area between the second-type semiconductor layer and the insulation layer.

3. The display device according to claim 1, wherein the first conductive layer and the insulation layer have a first overlapping width, the second conductive layer and the insulation layer have a second overlapping width, and the first overlapping width is less than or equivalent to the second overlapping width.

4. The display device according to claim 1, wherein the first conductive layer and the insulation layer have a first overlapping area, the second conductive layer and the insulation layer have a second overlapping area, and the first overlapping area is less than or equivalent to the second overlapping area.

5. The display device according to claim 1, wherein the first transistor comprises a drain and a source, and the drain, the source and the first conductive layer are formed of the same layer of conductive material.

6. The display device according to claim 1, wherein the sensing element at least partly overlaps the first transistor.

7. The display device according to claim 1, wherein the first transistor comprises a drain and a source, the first conductive layer is disposed on the drain and the source, and the first conductive layer is electrically connected to the drain or the source through a via.

8. The display device according to claim 1, wherein the display panel further comprises a transmission line disposed on the first substrate and electrically connected to the second conductive layer.

9. The display device according to claim 1, wherein the display panel has a display region and a peripheral region surrounding the display region, and the sensing element is disposed in the display region.

10. The display device according to claim 9, wherein the display panel further comprises a second transistor, the second transistor is disposed on the first substrate and in the display region.

11. The display device according to claim 10, wherein the display panel further comprises a transparent conductive layer, the transparent conductive layer correspondingly is disposed in a light penetrating region of the display region and electrically connected to the second transistor.

12. The display device according to claim 1, wherein the display panel has a display region and a peripheral region surrounding the display region, the display panel has at least one pixel region in the display region, the at least one pixel region has at least three sub-pixel regions, and the sensing element is disposed in at least one of the at least three sub-pixel regions.

13. The display device according to claim 1, wherein the first conductive layer comprises molybdenum metal, molybdenum alloy, aluminum metal, aluminum alloy or a non-transparent metal.

14. The display device according to claim 1, wherein the second conductive layer comprises a transparent conductive material.

15. The display device according to claim 1, wherein the display panel further comprises a transparent conductive layer, the transparent conductive layer is disposed on the first substrate, and the transparent conductive layer is not overlapped with the sensing element.

16. The display device according to claim 15, wherein the display panel further comprises a data line, the transparent conductive layer has a width measured along the data line, the first conductive layer and the insulation layer have a first overlapping width measured along an extension direction of the data line, a ratio of the width of the transparent conductive layer to the first overlapping width is in a range from 1 to 3.5.

17. The display device according to claim 1, wherein the second conductive layer comprises indium-zinc-oxide, indium-tin-oxide or a combination thereof.

18. The display device according to claim 1, wherein the display panel further comprises a data line and a read-out line, and the data line and the read-out line are formed of the same layer.

19. The display device according to claim 1, wherein the display panel further comprises a data line, and the sensing element extends along an extension direction of the data line.

* * * * *